United States Patent
Kikuchi

(10) Patent No.: US 8,125,614 B2
(45) Date of Patent: Feb. 28, 2012

(54) EXPOSURE APPARATUS AND DEVICE MANUFACTURING METHOD

(75) Inventor: Kazuya Kikuchi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 399 days.

(21) Appl. No.: 12/506,030

(22) Filed: Jul. 20, 2009

(65) Prior Publication Data

US 2010/0026975 A1    Feb. 4, 2010

(30) Foreign Application Priority Data

Jul. 29, 2008   (JP) .................................. 2008-195314

(51) Int. Cl.
*G03B 27/42*    (2006.01)

(52) U.S. Cl. ................. 355/53; 355/67; 355/71; 355/77
(58) Field of Classification Search .................... 355/53, 355/67, 71, 77
See application file for complete search history.

(56) References Cited

U.S. PATENT DOCUMENTS

| 2008/0106721 A1 | 5/2008 | Hirano |
| 2008/0143990 A1 | 6/2008 | Hirano |

FOREIGN PATENT DOCUMENTS

| JP | 61-034252 B | 8/1986 |
| JP | 5-055106 A | 3/1993 |
| JP | 2008-118062 A | 5/2008 |
| JP | 2008-153402 A | 7/2008 |

*Primary Examiner* — Edward Glick
*Assistant Examiner* — Mesfin T Asfaw
(74) *Attorney, Agent, or Firm* — Canon USA Inc. IP Division

(57) ABSTRACT

An exposure apparatus includes a shutter, an exposure dose sensor configured to detect an exposure dose on a substrate, and a controller configured to control an exposure operation in accordance with control modes of the shutter, which include a first mode in which an exposure time of the substrate is controlled by opening the shutter and thereafter closing the shutter based on the output from the exposure dose sensor, and a second mode in which the exposure time of the substrate is controlled by controlling an operation speed of the shutter based on control information determined in advance based on a target.

8 Claims, 9 Drawing Sheets

EXPOSURE APPARATUS AND DEVICE MANUFACTURING METHOD

BACKGROUND OF THE INVENTION

1. Field of the Invention

The present invention relates to an exposure apparatus which illuminates an original with light from a light source, and projects the pattern of the original onto a substrate by a projection optical system, thereby exposing the substrate.

2. Description of the Related Art

Japanese Patent Publication No. 61-34252 discloses an exposure apparatus having an arrangement which detects, by a photoelectric detector, the intensity of light from a recording target or light applied to a recording target to obtain a series of output pulses having a frequency corresponding to the detected value, counts the number of output pulses, and closes a shutter when the counted number of pulses has reached a predetermined number of pulses. The shutter includes one rotating disk on which light-shielding and light-transmitting portions are formed alternately, and is rotationally driven to control the states, in which the illumination light is shielded and transmitted.

In exposure control with a small exposure dose, an arrangement as disclosed in Japanese Patent Publication No. 61-34252 often fails to close the shutter in time. To combat this problem, the following methods can be adopted. One method closes the shutter without counting the number of pulses. Another method counts the number of pulses in the above-described way while the light intensity is low, and closes the shutter when the counted number of pulses has reached a predetermined number of pulses.

However, the method of closing the shutter without counting the number of pulses must not be adopted if the required exposure dose accuracy is relatively high although it is advantageous to improve the throughput if the required exposure dose accuracy is relatively low. Also, the method of decreasing the light intensity is disadvantageous in respect of the throughput if the required exposure dose accuracy is relatively low although it is useful if the required exposure dose accuracy is relatively high.

SUMMARY OF THE INVENTION

The present invention provides an exposure apparatus advantageous to improve the throughput while satisfying the required exposure dose accuracy.

One embodiment of the present invention provides an exposure apparatus which illuminates an original with light from a light source, and projects a pattern of the original onto a substrate by a projection optical system to expose the substrate, the apparatus comprising a shutter inserted between the light source and a plane where the original is disposed, an exposure dose sensor configured to detect an exposure dose on the substrate, and a controller configured to control an exposure operation in accordance with control modes of the shutter, which include a first mode in which an exposure time of the substrate is controlled by opening the shutter and thereafter closing the shutter based on the output from the exposure dose sensor, and a second mode in which the exposure time of the substrate is controlled by controlling an operation speed of the shutter based on control information determined in advance based on a target, wherein the controller is configured to control the exposure operation so that the substrate is exposed in the first mode with light having a first intensity if a first required exposure time that is an exposure time required to expose the substrate in the first mode with light having the first intensity is longer than a reference time, the substrate is exposed in the first mode with light having a second intensity lower than the first intensity if the first required exposure time is shorter than the reference time, and a required exposure dose accuracy is higher than a reference level, the substrate is exposed in the first mode with light having the second intensity if the first required exposure time is shorter than the reference time, the required exposure dose accuracy is lower than the reference level, and a second required exposure time that is an exposure time required to expose the substrate in the second mode with light having the first intensity is longer than the reference time, and the substrate is exposed in the second mode with light having the first intensity if the first required exposure time is shorter than the reference time, the required exposure dose accuracy is lower than the reference level, and the second required exposure time is shorter than the reference time.

Further features and aspects of the present invention will become apparent from the following description of exemplary embodiments with reference to the attached drawings.

DESCRIPTION OF THE EMBODIMENTS

Embodiments of the present invention will be described below with reference to the accompanying drawings.

Figure 1:
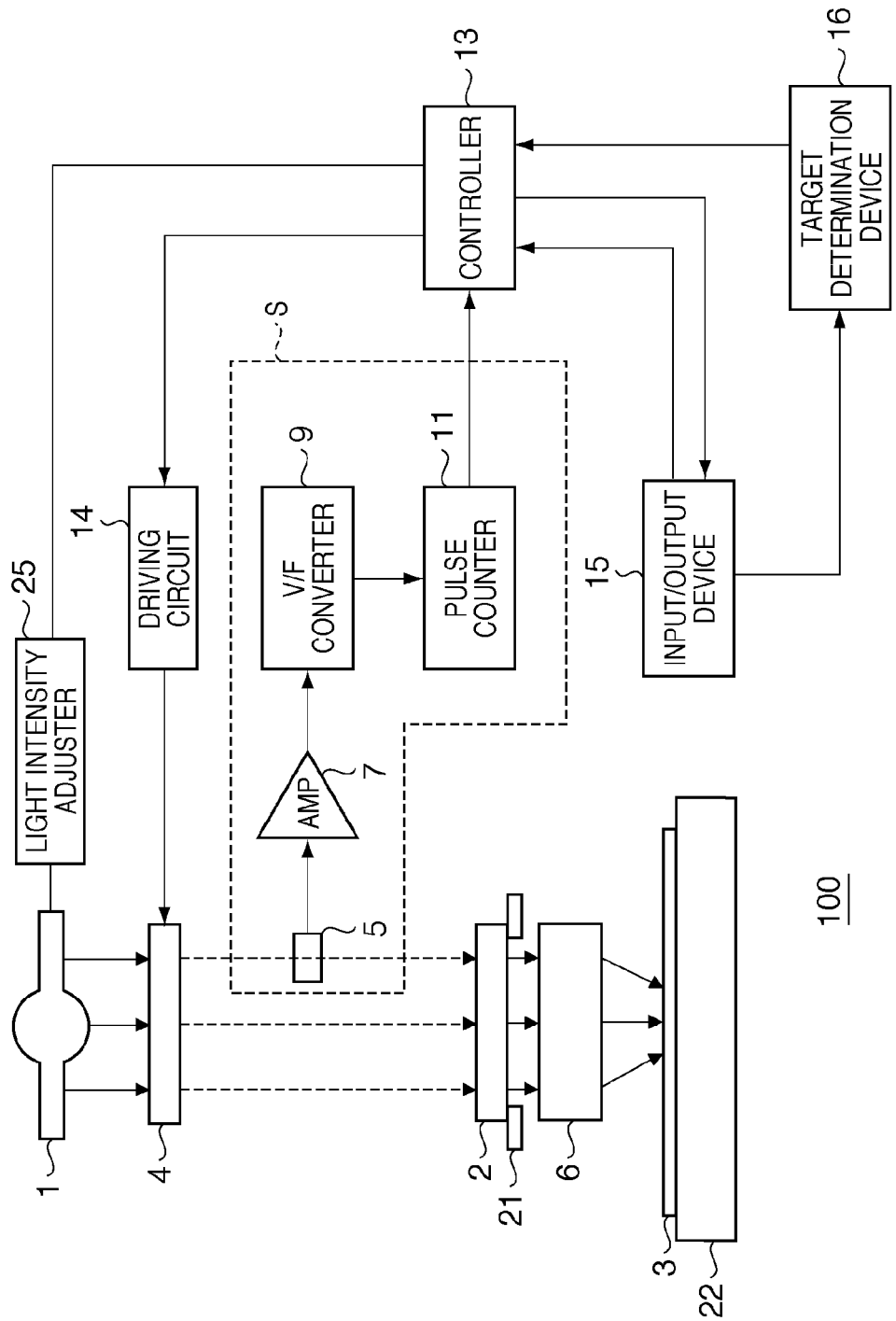
FIG. 1 is a block diagram showing the schematic arrangement of an exposure apparatus according to an embodiment of the present invention.

FIG. 1 is a block diagram showing the schematic arrangement of an exposure apparatus according to an embodiment of the present invention. An exposure apparatus 100 according to a preferred embodiment of the present invention includes a light source 1, shutter 4, original stage 21, projection optical system 6, substrate stage 22, and light intensity adjuster 25. The original stage 21 holds and positions an original (reticle) 2. The original 2 has a pattern such as a semiconductor circuit pattern formed on it, and is illuminated with light emitted by the light source 1. The light source 1 can typically include a lamp which continuously emits light.

The substrate stage 22 holds and positions a substrate (wafer) 3 coated with a photoresist (photosensitive agent). The pattern of the original 2 is projected onto the substrate 3 via the projection optical system 6 to form a latent image pattern on the photoresist applied on the substrate 3. The latent image pattern is developed by a developer to form a resist pattern on the substrate 3.

The shutter 4 is inserted between the light source 1 and the plane where the original 2 is disposed (i.e., between the light source 1 and the original stage 21). The shutter 4 determines the exposure time of the substrate 3 by controlling the time for which the light from the light source 1 is applied to the original 2.

The light intensity adjuster 25 adjusts the intensity of light which illuminates the original 2. Adjusting the intensity of light which illuminates the original 2 amounts to adjusting the intensity of light to which the substrate 3 is exposed. The light intensity adjuster 25 can be configured to be able to adjust the light intensity continuously or step by step. The light intensity adjuster 25 can be configured to adjust the intensity of light, which illuminates the original 2, by, for example, adjusting the position of the lamp in the light source 1 or inserting a light attenuating filter in the light path (between the light source 1 and the original 2).

The exposure apparatus 100 includes an exposure dose sensor S which detects the exposure dose on the substrate 3. The exposure dose sensor S can include, for example, a photosensor 5, amplifier 7, V/F converter 9, and pulse counter 11. The photosensor 5 detects the light intensity between the shutter 4 and the original stage 21. The photosensor 5 includes a light-receiving element. The light-receiving element may be inserted in the illumination light path between the shutter 4 and the original stage 21, or receive the light extracted from the light path by a mirror. The amplifier 7 converts a signal indicating the light intensity output from the photosensor 5 into a voltage signal. The V/F converter 9 converts the voltage signal output from the amplifier 7 into a frequency signal. The pulse counter 11 counts the number of pulses in the frequency signal output from the V/F converter 9. Since the count value counted by the pulse counter 11 means a quantity obtained by integrating the light intensity, it is proportional to the exposure dose on the substrate. Hence, information representing the exposure dose on the substrate is obtained based on the resultant count value.

The exposure apparatus 100 can also include, e.g., a controller 13, input/output device 15, target determination device 16, and driving circuit 14. The controller 13 controls the exposure operation on the substrate 3. In response to the instruction from the controller 13, the driving circuit 14 operates the shutter 4. The input/output device (console) 15 serves to input/output various kinds of information. The target determination device 16 determines the target based on the exposure conditions input via the input/output device 15 and other information input as needed.

Figure 2A:
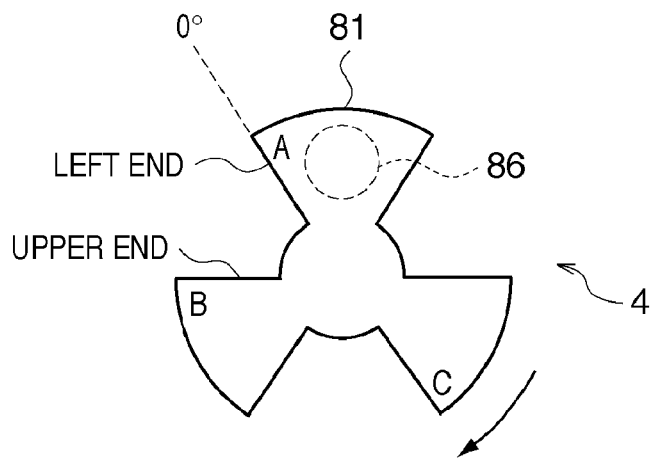
FIGS. 2A to 2C are views for explaining exposure control by the shutter operation.
Figure 2B:
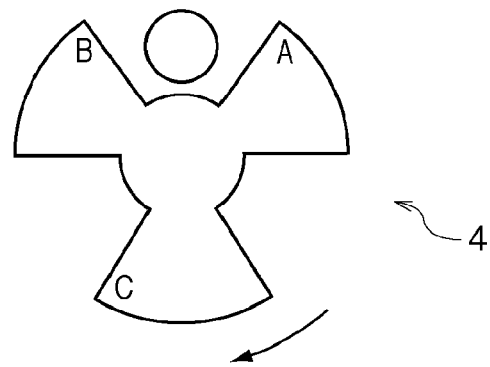
Figure 2C:
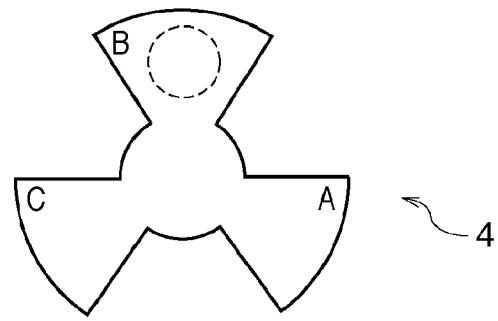

FIGS. 2A to 2C are views for explaining exposure control by the operation of the shutter 4. The shutter 4 includes a shutter plate 81 rotationally driven by a rotating mechanism (not shown). The shutter plate 81 includes light-shielding portions A, B, and C, and non-light-shielding portions formed between them. FIGS. 2A to 2C illustrate the positional relationships among the light-shielding portions A, B, and C on the shutter plate 81 and a light path region 86 through which the light passes. FIG. 2A shows the state in which the light path region 86 is shielded by the light-shielding portion A on the shutter plate 81. FIG. 2B shows the state in which the light path region 86 is not shielded after the shutter plate 81 has rotated clockwise through 60° from the state shown in FIG. 2A. FIG. 2C shows the state in which the light path region 86 is shielded again by the light-shielding portion B after the shutter plate 81 has further rotated clockwise through 60° from the state shown in FIG. 2B. While the light path region 86 is not shielded, the shutter 4 is open. While the light path region 86 is shielded, the shutter 4 is closed.

It takes an appropriate minimum time for the shutter 4 to return to a closed state (FIG. 2C) again from a previous closed state (FIG. 2A) through an open state (FIG. 2B). Based on the minimum time, a reference time Tmin to determine the control mode of the shutter 4 is determined. The reference time Tmin may be equal to the minimum time or the time obtained by adding a margin to the minimum time.

The control mode of the shutter 4 includes a first mode and second mode. The first mode is a mode in which the exposure time of the substrate 3 is controlled by opening the shutter 4 and thereafter closing it based on the output from the exposure dose sensor S. The second mode is a mode in which the exposure time of the substrate 3 is controlled by controlling the operation speed of the shutter 4 based on control information determined in advance based on the target. In this embodiment, the operation speed of the shutter 4 can be controlled by controlling its rotation speed. The control mode of the shutter 4 may be stored in advance in a storage means such as a memory or stored using an external storage medium after the start-up of the exposure apparatus 100.

If a first required exposure time Td1 when the substrate is exposed in the first mode with light having a first intensity (typically, the maximum intensity of light emitted by the light source 1) is longer than the reference time Tmin, the controller 13 controls the exposure operation so that the substrate is exposed in the first mode with light having the first intensity.

The controller 13 controls the exposure operations so that:

(1) the substrate is exposed in the first mode with light having a second intensity lower than the first intensity if the first required exposure time Td1 is shorter than the reference time Tmin, and the required exposure dose accuracy is higher than a reference level;

(2) the substrate is exposed in the first mode with light having the second intensity lower than the first intensity if the first required exposure time Td1 is shorter than the reference time Tmin, the required exposure dose accuracy is lower than the reference level, and a second required exposure time Td2 when the substrate is exposed in the second mode with light having the first intensity is longer than the reference time Tmin; and (3) the substrate is exposed in the second mode with light having the first intensity if the first required exposure time Td1 is shorter than the reference time Tmin, the required exposure dose accuracy is lower than the reference level, and the second required exposure time Td2 is shorter than the reference time Tmin.

Figure 3:
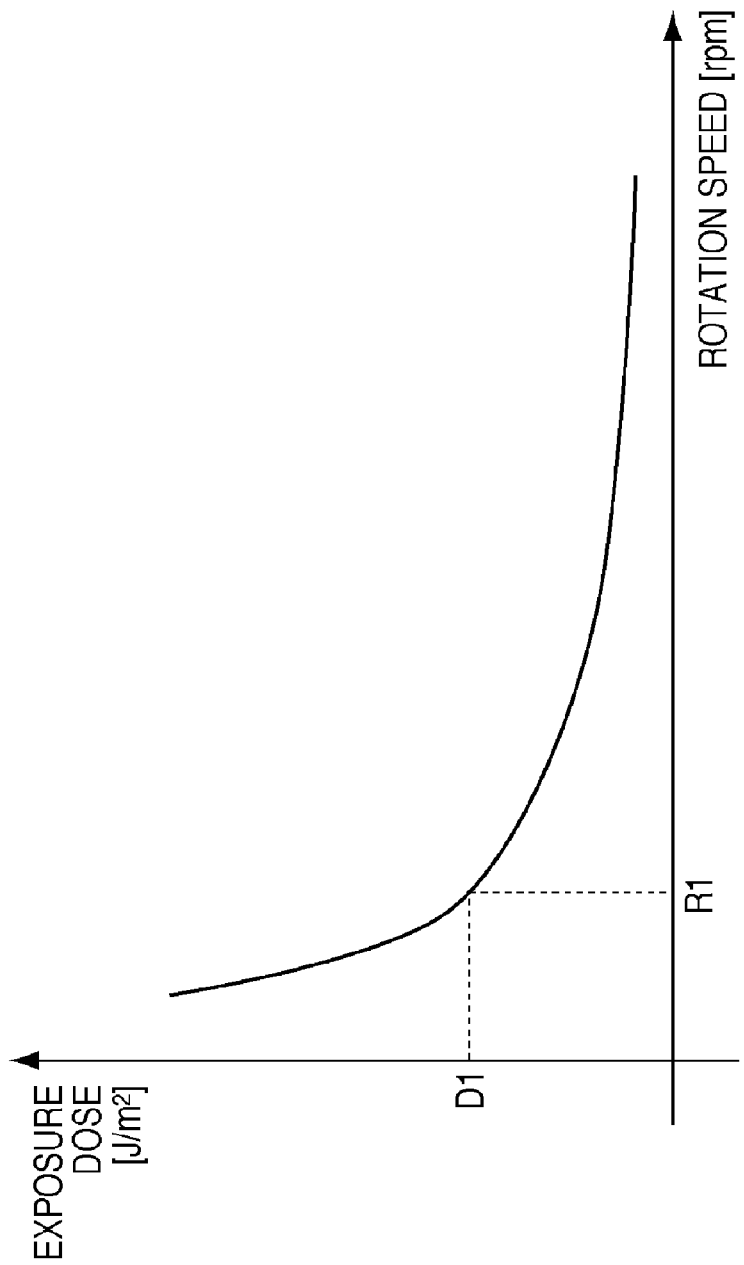
FIG. 3 is a graph showing the relationship between the shutter rotation speed [rpm] and the exposure dose [$J/m^2$] in a second mode.

FIG. 3 is a graph showing the relationship between the rotation speed [rpm] of the shutter 4 (and, more specifically, the shutter plate 81) and the exposure dose [J/m²] in the second mode. The relationship between the rotation speed of the shutter 4 and the exposure dose, as illustrated in FIG. 3, can be obtained by an experiment or computation and stored in advance in a memory (not shown) in the controller 13 as, for example, an approximation function or a data table.

Figure 7A:
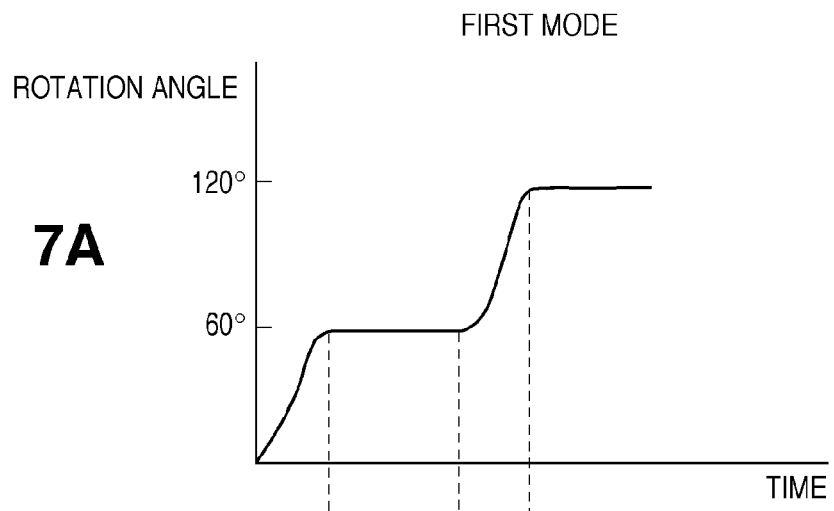
FIGS. 7A to 7C are charts respectively illustrating the rotation angle and angular velocity of a shutter plate and the illuminance on the substrate surface in the first mode.
Figure 7B:
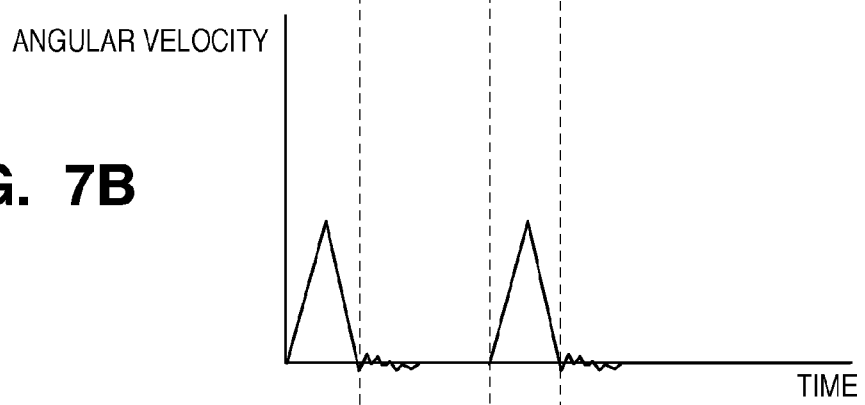
Figure 7C:
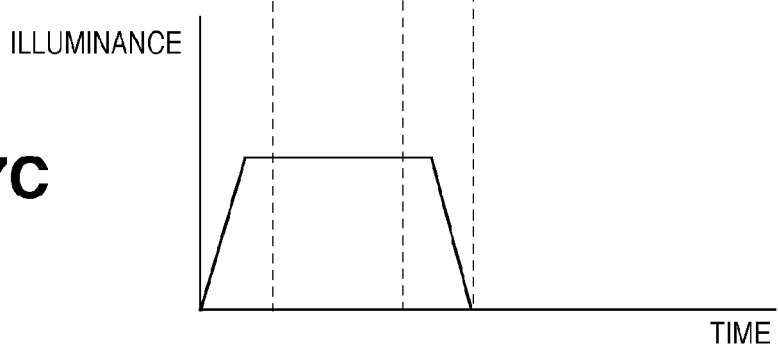
Figure 8A:
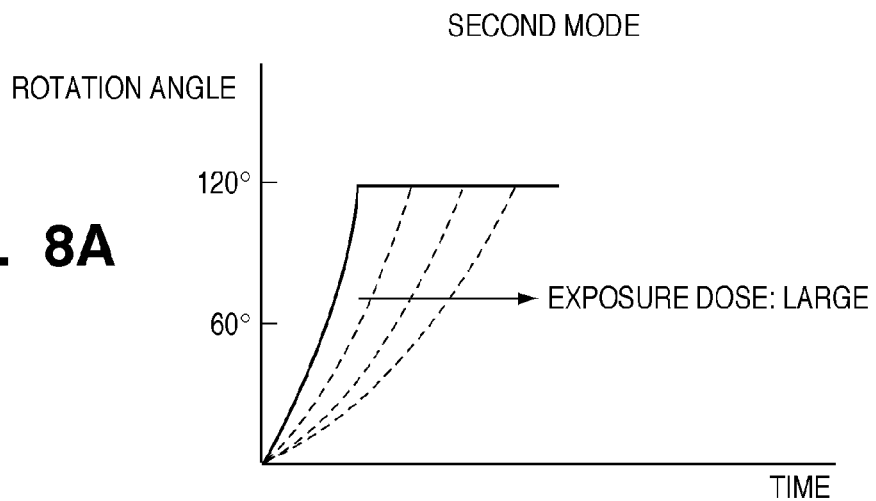
FIGS. 8A to 8C are charts respectively illustrating the rotation angle and angular velocity of the shutter plate and the illuminance on the substrate surface in the second mode.
Figure 8B:
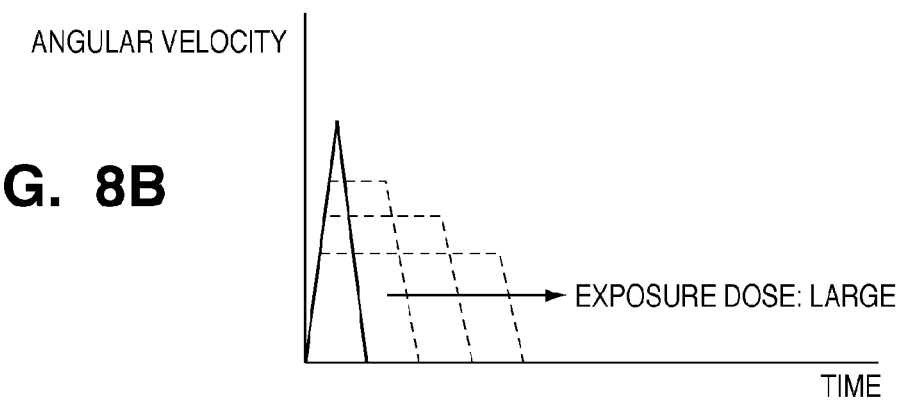
Figure 8C:
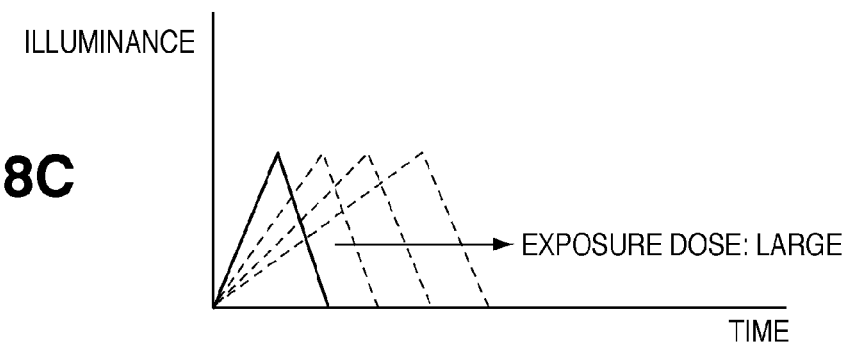

FIGS. 7A to 7C are charts respectively illustrating the rotation angle and angular velocity of the shutter plate 81 and the illuminance on the surface of the substrate 3 in the first mode. FIGS. 8A to 8C are charts respectively illustrating the rotation angle and angular velocity of the shutter plate 81 and the illuminance on the surface of the substrate 3 in the second mode. In the second mode, the shutter plate 81 is rotated in accordance with the angular velocity profile (control information) corresponding to the rotation speed [rpm] of the shutter plate 81 illustrated in FIG. 3. Note that the information required to determine the angular velocity profile (control information) based on the rotation speed [rpm] of the shutter plate 81 can be stored in advance in the memory in the controller 13. The angular velocity profile (control information) may be determined directly from the targeted exposure dose [J/m$^2$]. In the second mode, the controller 13 causes the driving circuit 14 to drive the shutter 4 (the rotating mechanism of the shutter plate 81) in accordance with the angular velocity profile corresponding to the targeted exposure dose [J/m$^2$].

In this embodiment, since the rotation speed [rpm] of the shutter plate 81 is determined in accordance with the targeted exposure dose [J/m$^2$], the required exposure time in the second mode may exceed the reference time Tmin if the targeted exposure dose is relatively large. The exposure dose accuracy in the second mode is lower than that in the first mode because the timing at which the shutter 4 is closed is not controlled based on the output from the exposure dose sensor S in the second mode. In view of this, if the required exposure time in the second mode exceeds the reference time Tmin, it is no longer necessary to perform exposure in the second mode. Hence, in such a case, the controller 13 decreases the intensity of light for use in substrate exposure from the first intensity to the second intensity, and controls the exposure operation to expose the substrate in the first mode.

Figure 4:
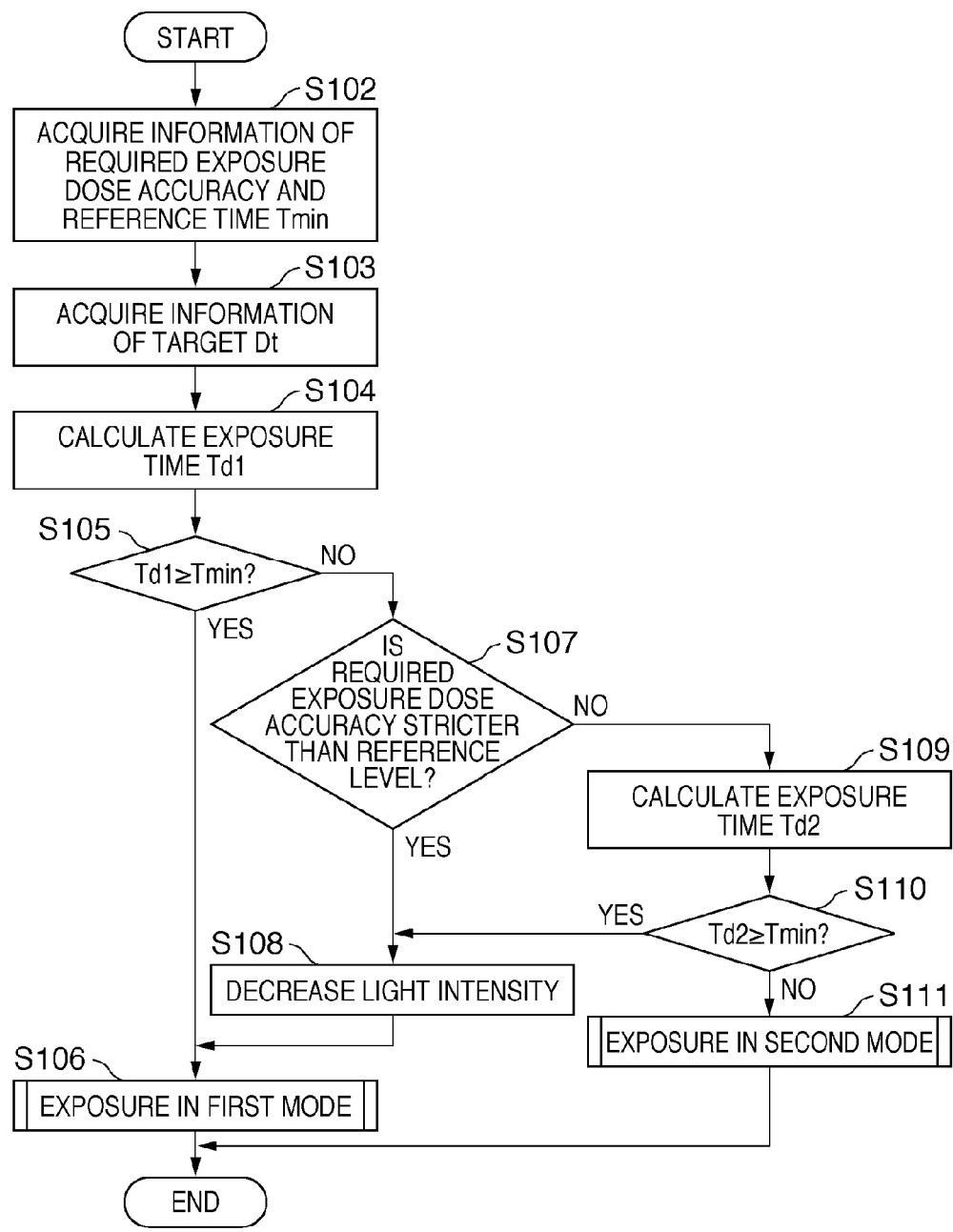
FIG. 4 is a flowchart showing the sequence of an exposure process according to a preferred embodiment of the present invention.

FIG. 4 is a flowchart showing the sequence of an exposure process according to a preferred embodiment of the present invention. The controller 13 controls this exposure process. Assume that in this example, the intensity of light which illuminates the original 2 is set to a first intensity (typically, a maximum intensity) upon the default setting (initial setting), and can be set to a second intensity lower than the first intensity in step S108.

First, in step S102, the controller 13 acquires information of a required exposure dose accuracy and reference time Tmin from the input/output device 15. The required exposure dose accuracy means herein the exposure dose accuracy required in the exposure process, and can be expressed by, for example, multiple levels. In a simplest example, the required exposure dose accuracy can be expressed by two levels, for example, whether it is stricter than a reference level. In the example of the exposure process shown in the flowchart of FIG. 4, the required exposure dose accuracy is expressed by whether it is stricter than a reference level. The reference time Tmin is used to determine whether to expose the substrate in the first or second mode.

In step S103, the controller 13 acquires information of a target Dt from the target determination device 16.

In step S104, the controller 13 calculates a first required exposure time Td1 as the exposure time required to expose the substrate in the first mode. The first required exposure time Td1 can be calculated in accordance with:

$$Td1 = (Dt/I) + Ts \quad (1)$$

where I is the intensity value of light which strikes the substrate 3 (the light intensity value is proportional to illumination light which illuminates the original 2), and Ts is the operation lag time of the shutter 4.

The light intensity value I may be determined based on, for example, the output value of the exposure dose sensor S, which has been obtained and stored upon previous substrate exposure. Alternatively, the light intensity value I may be determined based on the result of measuring the light intensity by the exposure dose sensor S by operating the shutter 4 on trial before exposure.

In step S105, the controller 13 compares the first required exposure time Td1 calculated in step S104 with the reference time Tmin. If the first required exposure time Td1 is longer than or equal to the reference time Tmin (YES in step S105), the controller 13 advances the process to step S106. If the first required exposure time Td1 is shorter than the reference time Tmin (NO in step S105), the controller 13 advances the process to step S107. Note that if the first required exposure time Td1 is equal to the reference time Tmin, the process subsequent to step S105 depends on the method of determining the reference time Tmin. In this example, if the first required exposure time Td1 is equal to the reference time Tmin, the controller 13 advances the process to step S107.

In step S106, the controller 13 controls the exposure operation so that the substrate is exposed in the first mode with light having the set intensity (in this example, the set intensity can be the first or second intensity).

In step S107, the controller 13 checks whether the required exposure dose accuracy is higher than the reference level (whether it is stricter than the reference level). If the required exposure dose accuracy is higher than the reference level (YES in step S107), the controller 13 advances the process to step S108. If the required exposure dose accuracy is lower than the reference level (NO in step S107), the controller 13 advances the process to step S109. When, for example, the required exposure dose accuracy is expressed by whether it is stricter than the reference level, the reference level, a required exposure dose accuracy stricter than the reference level, and a required exposure dose accuracy less strict than the reference level can be defined as 2, 3, and 1, respectively. In this case, it is possible to determine whether the required exposure dose accuracy is stricter than the reference level by comparing the numeric values indicating the required exposure accuracy and the reference level.

In step S108, the controller 13 causes the light intensity adjuster 25 to change the intensity of light which illuminates the original 2 (the intensity of light which strikes the substrate 3) from the first intensity to the second intensity lower than that. Note that if the required exposure dose accuracy is stricter than the reference level, the substrate cannot be exposed in the second mode. In this case, it is necessary to decrease the intensity of light for use in exposure so that the required exposure time exceeds the reference time Tmin.

Subsequent to step S108, step S106 is executed. In step S106 after step S108, the substrate 3 is exposed in the first mode with light having the second intensity.

In step S109, the controller 13 calculates a second required exposure time Td2 as the exposure time required to expose the substrate in the second mode with light having the first intensity. More specifically, the controller 13 calculates the shutter rotation speed corresponding to a target Dt in accordance with the approximation function or data table corresponding to the graph illustrated in FIG. 3, and determines a second required exposure time Td2 corresponding to the calculated rotation speed. In one example, the rotation speed corresponding to a target Dt of D1 is R1. The second required exposure time Td2 may be determined in accordance with, for example, the angular velocity profile corresponding to the rotation speed, or an actual measurement value registered in advance.

In step S110, the controller 13 compares the second required exposure time Td2 calculated in step S109 with the reference time Tmin. If the second required exposure time Td2 is longer than the reference time Tmin (YES in step S110), the controller 13 advances the process to step S108. If the second required exposure time Td2 is shorter than the reference time Tmin (NO in step S110), the controller 13 advances the process to step S111. Note that if the second required exposure time Td2 is equal to the reference time Tmin, the process subsequent to step S110 depends on the method of determining the reference time Tmin. In this example, if the second required exposure time Td2 is equal to the reference time Tmin, the controller 13 advances the process to step S108.

If the second required exposure time Td2 is longer than the reference time Tmin, the intensity of light which illuminates the original 2 is changed from the first intensity to the second intensity lower than that in step S108. After that, the substrate is exposed in the first mode in step S106. On the other hand, if the second required exposure time Td2 is shorter than the reference time Tmin, the substrate is exposed in step S111 while keeping the default light intensity, i.e., the first intensity unchanged.

Figure 9:
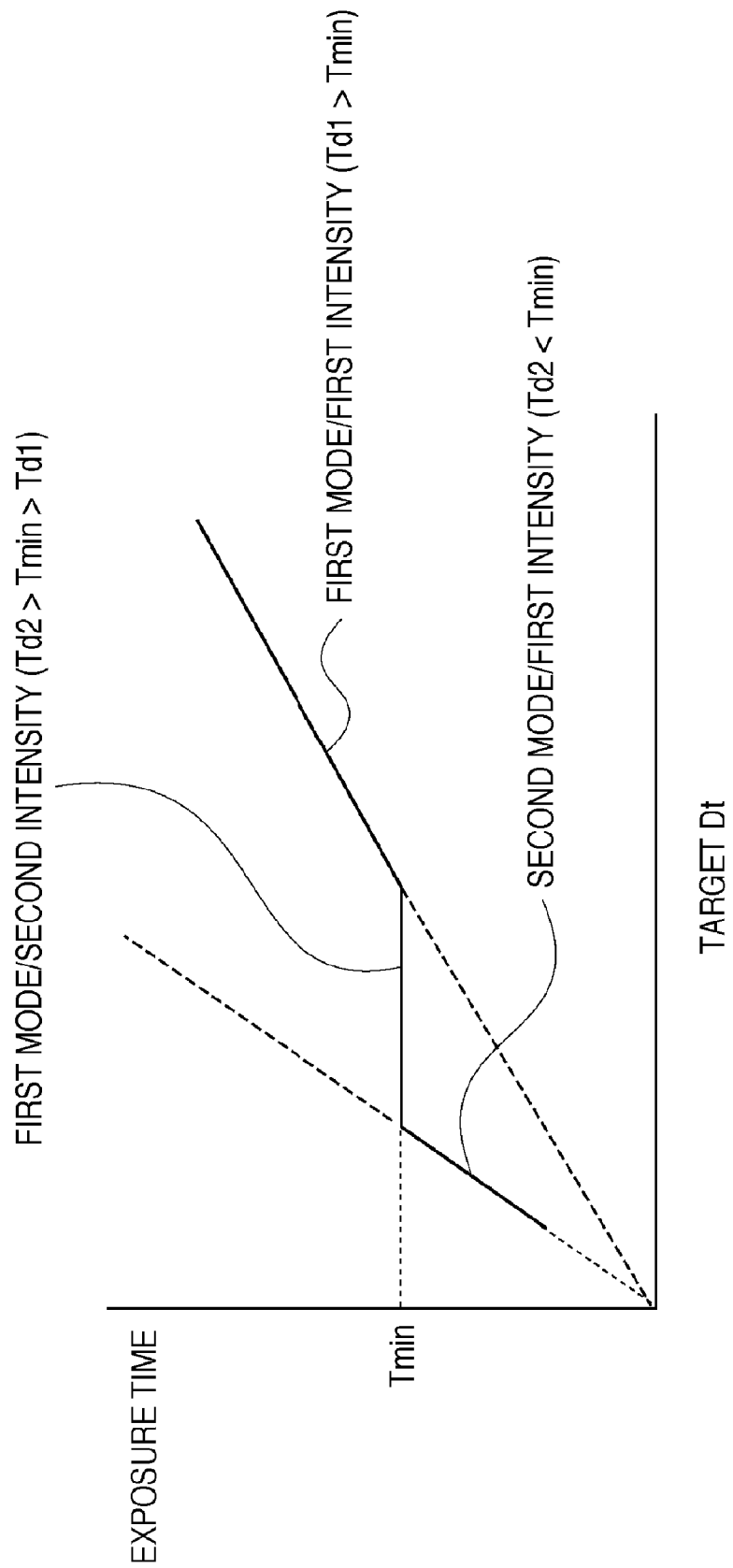
FIG. 9 is a graph illustrating the relationship among a target Dt, the control mode (first mode/second mode), the light intensity (first intensity/second intensity), a first required exposure time Td1, a second required exposure time Td2, and a reference time Tmin.

FIG. 9 is a graph illustrating the relationship among the target Dt, the control mode (first mode/second mode), the light intensity (first intensity/second intensity), the first required exposure time Td1, the second required exposure time Td2, and the reference time Tmin.

A case in which the second required exposure time Td2 may be longer than the first required exposure time Td1 (i.e., a case in which the second required exposure time Td2 may be determined to be shorter than the reference time Tmin in step S110) depending on circumstances involved has been exemplified above. If the second required exposure time Td2 is always shorter than the first required exposure time Td1, steps S109 and S110 are unnecessary. In this case, if the required exposure dose accuracy is determined to be lower than the reference level in step S107, the controller 13 always advances the process to step S111, in which the substrate is exposed in the second mode with light having the first intensity.

Figure 5:
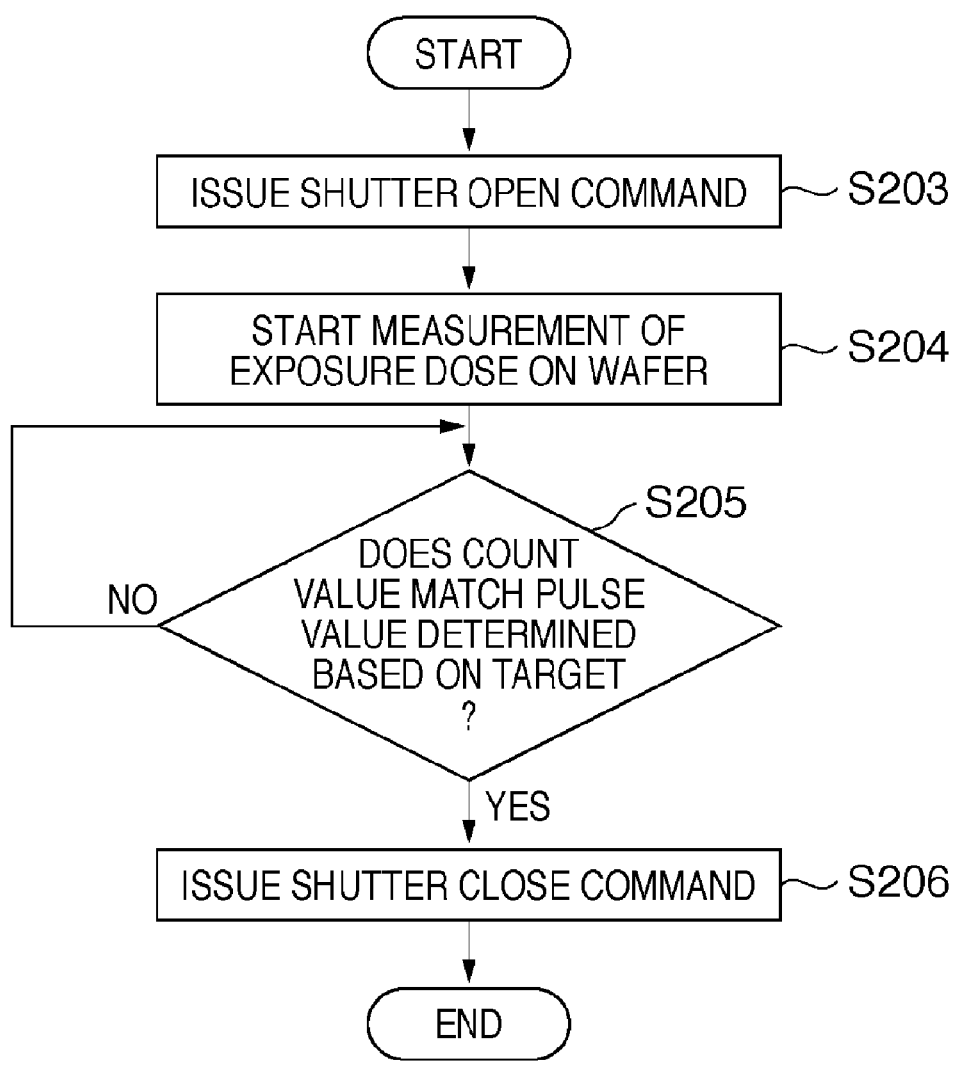
FIG. 5 is a flowchart showing details of a substrate exposure process in a first mode.

FIG. 5 is a flowchart showing details of step S106, in which the substrate is exposed in the first mode. The first mode is a mode in which the exposure time of the substrate 3 is controlled by opening the shutter 4 and thereafter closing it based on the output from the exposure dose sensor S, as described above.

In step S203, the controller 13 issues a shutter open command to the driving circuit 14 to cause it to open the shutter 4. Upon opening the shutter 4, the exposure of the substrate 3 starts.

In step S204, the measurement of the exposure dose on the substrate 3 starts. In this measurement, a signal indicating the light intensity output from the photosensor 5 is converted into a voltage signal by the amplifier 7, the voltage signal is converted into a pulse train by the V/F converter 9, and the number of pulses in the pulse train is counted by the pulse counter 11.

In step S205, the controller 13 reads the count value provided from the pulse counter 11, and checks whether the count value matches the pulse value determined based on the target Dt. Step S205 is repeated until the count value provided from the pulse counter 11 matches the pulse value determined based on the target Dt. When these two values match each other (YES in step S205), the controller 13 advances the process to step S206.

In step S206, the controller 13 issues a shutter close command to the driving circuit 14 to cause it to close the shutter 4.

Figure 6:
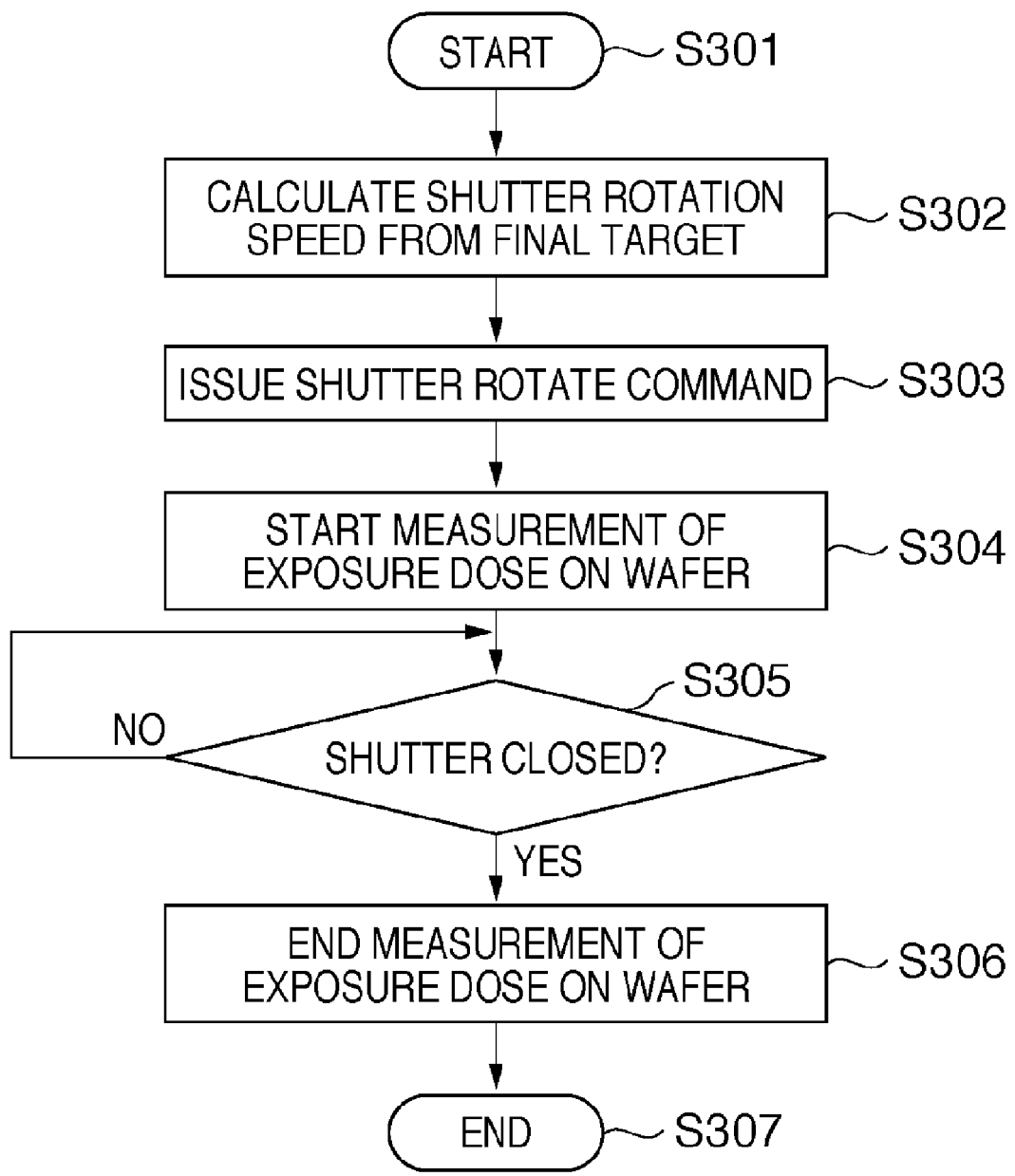
FIG. 6 is a flowchart showing details of a substrate exposure process in the second mode.

FIG. 6 is a flowchart showing details of step S111, in which the substrate is exposed in the second mode. The second mode is a mode in which the exposure time of the substrate 3 is controlled by controlling the speed of the shutter 4 based on the control information determined in advance based on the target Dt, as described above.

In step S302, the controller 13 calculates the rotation speed [rpm] of the shutter 4 corresponding to the target Dt. More specifically, the controller 13 calculates the shutter rotation speed corresponding to the target Dt in accordance with the approximation function or data table corresponding to the graph illustrated in FIG. 3.

In step S303, the controller 13 issues a shutter rotate command to the driving circuit 14 to cause it to rotate the shutter 4. Upon rotating the shutter 4, it returns to a closed state again from a previous closed state through an open state.

In step S304, the measurement of the exposure dose on the substrate 3 starts. In this measurement, a signal indicating the light intensity output from the photosensor 5 is converted into a voltage signal by the amplifier 7, the voltage signal is converted into a pulse train by the V/F converter 9, and the number of pulses in the pulse train is counted by the pulse counter 11. Since the counted number of pulses is proportional to the exposure dose on the substrate, this exposure dose can be measured by counting the number of pulses.

In step S305, the controller 13 waits, until the timing at which the shutter 4 is closed comes, based on the shutter rotation speed. After that, in step S306, the controller 13 ends the count operation of the pulse counter 11 (i.e., the measurement of the exposure dose). The count value (exposure dose) measured in this way can be taken into consideration in order to determine the shutter rotation speed in step S302, which can be executed at the next time.

A device manufacturing method according to a preferred embodiment of the present invention is suitable for manufacturing, for example, a semiconductor device and a liquid crystal device. This method can include, for example, a step of transferring the pattern of an original onto a photosensitive agent applied on a substrate using the above-mentioned exposure apparatus, and a step of developing the photosensitive agent. The devices are manufactured by known subsequent steps (e.g., etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-195314, filed Jul. 29, 2008, which is hereby incorporated by reference herein in its entirety.

What is claimed is:

1. An exposure apparatus which illuminates an original with light from a light source, and projects a pattern of the original onto a substrate by a projection optical system to expose the substrate, the apparatus comprising:

a shutter inserted between the light source and a plane where the original is disposed;

an exposure dose sensor configured to detect an exposure dose on the substrate; and a controller configured to control an exposure operation in accordance with control modes of the shutter, which include a first mode in which an exposure time of the substrate is controlled by opening the shutter and thereafter closing the shutter based on the output from the exposure dose sensor, and a second mode in which the exposure time of the substrate is controlled by controlling an operation speed of the shutter based on control information determined in advance based on a target, wherein the controller is configured to control the exposure operation so that, the substrate is exposed in the first mode with light having a first intensity if a first required exposure time that is an exposure time required to expose the substrate in the first mode with light having the first intensity is longer than a reference time, the substrate is exposed in the first mode with light having a second intensity lower than the first intensity if the first required exposure time is shorter than the reference time, and a required exposure dose accuracy is higher than a reference level, the substrate is exposed in the first mode with light having the second intensity if the first required exposure time is shorter than the reference time, the required exposure dose accuracy is lower than the reference level, and a second required exposure time that is an exposure time required to expose the substrate in the second mode with light having the first intensity is longer than the reference time, and the substrate is exposed in the second mode with light having the first intensity if the first required exposure time is shorter than the reference time, the required exposure dose accuracy is lower than the reference level, and the second required exposure time is shorter than the reference time.

2. The apparatus according to claim 1, wherein the shutter includes a shutter plate which has a light-shielding portion and a non-light-shielding portion, and is driven rotationally.

3. The apparatus according to claim 1, wherein the light source includes a lamp.

4. An exposure apparatus which illuminates an original with light from a light source, and projects a pattern of the original onto a substrate by a projection optical system to expose the substrate, the apparatus comprising:

a shutter inserted between the light source and a plane where the original is disposed;

an exposure dose sensor configured to detect an exposure dose on the substrate; and a controller configured to control an exposure operation in accordance with control modes of the shutter, which include a first mode in which an exposure time of the substrate is controlled by opening the shutter and thereafter closing the shutter based on the output from the exposure dose sensor, and a second mode in which the exposure time of the substrate is controlled by controlling an operation speed of the shutter based on control information determined in advance based on a target, wherein the controller is configured to control the exposure operation so that, the substrate is exposed in the first mode with light having a first intensity if a first required exposure time that is an exposure time required to expose the substrate in the first mode with light having the first intensity is longer than a reference time, the substrate is exposed in the first mode with light having a second intensity lower than the first intensity if the first required exposure time is shorter than the reference time, and a required exposure dose accuracy is higher than a reference level, and the substrate is exposed in the second mode with light having the first intensity if the first required exposure time is shorter than the reference time, and the required exposure dose accuracy is lower than the reference level.

5. The apparatus according to claim 4, wherein the shutter has a light-shielding portion and a non-light-shielding portion, and is driven rotationally.

6. The apparatus according to claim 4, wherein the light source includes a lamp.

7. A device manufacturing method comprising the steps of:
exposing a substrate coated with photosensitive agent, using an exposure apparatus; and
developing the substrate,
wherein the exposure apparatus is configured to illuminate an original with light from a light source, and to project a pattern of the original onto a substrate by a projection optical system to expose the substrate, the apparatus comprising:

a shutter inserted between the light source and a plane where the original is disposed;

an exposure dose sensor configured to detect an exposure dose on the substrate; and a controller configured to control an exposure operation in accordance with control modes of the shutter, which include a first mode in which an exposure time of the substrate is controlled by opening the shutter and thereafter closing the shutter based on the output from the exposure dose sensor, and a second mode in which the exposure time of the substrate is controlled by controlling an operation speed of the shutter based on control information determined in advance based on a target, wherein the controller is configured to control the exposure operation so that the substrate is exposed in the first mode with light having a first intensity if a first required exposure time that is an exposure time required to expose the substrate in the first mode with light having the first intensity is longer than a reference time, the substrate is exposed in the first mode with light having a second intensity lower than the first intensity if the first required exposure time is shorter than the reference time, and a required exposure dose accuracy is higher than a reference level, the substrate is exposed in the first mode with light having the second intensity if the first required exposure time is shorter than the reference time, the required exposure dose accuracy is lower than the reference level, and a second required exposure time that is an exposure time required to expose the substrate in the second mode with light having the first intensity is longer than the reference time, and the substrate is exposed in the second mode with light having the first intensity if the first required exposure time is shorter than the reference time, the required exposure dose accuracy is lower than the reference level, and the second required exposure time is shorter than the reference time.

8. A device manufacturing method comprising the steps of:
exposing a substrate coated with photosensitive agent, using an exposure apparatus; and
developing the substrate,
wherein the exposure apparatus is configured to illuminate an original with light from a light source, and to project a pattern of the original onto a substrate by a projection optical system to expose the substrate, the apparatus comprising:

a shutter inserted between the light source and a plane where the original is disposed;

an exposure dose sensor configured to detect an exposure dose on the substrate; and a controller configured to control an exposure operation in accordance with control modes of the shutter, which include a first mode in which an exposure time of the substrate is controlled by opening the shutter and thereafter closing the shutter based on the output from the exposure dose sensor, and a second mode in which the exposure time of the substrate is controlled by controlling an operation speed of the shutter based on control information determined in advance based on a target,
wherein the controller is configured to control the exposure operation so that the substrate is exposed in the first mode with light having a first intensity if a first required exposure time that is an exposure time required to expose the substrate in the first mode with light having the first intensity is longer than a reference time, the substrate is exposed in the first mode with light having a second intensity lower than the first intensity if the first required exposure time is shorter than the reference time, and a required exposure dose accuracy is higher than a reference level, and the substrate is exposed in the second mode with light having the first intensity if the first required exposure time is shorter than the reference time, and the required exposure dose accuracy is lower than the reference level.

* * * * *